United States Patent [19]

Frey

[11] 4,200,880
[45] Apr. 29, 1980

[54] MICROWAVE TRANSISTOR WITH DISTRIBUTED OUTPUT SHUNT TUNING

[75] Inventor: Richard H. Frey, Hampton, N.J.

[73] Assignee: Microwave Semiconductor Corp., Somerset, N.J.

[21] Appl. No.: 891,009

[22] Filed: Mar. 28, 1978

[51] Int. Cl.² ............................................. H01L 27/02
[52] U.S. Cl. ........................................ 357/51; 357/55; 357/68; 357/80
[58] Field of Search ...................... 357/51, 55, 68, 80

[56] References Cited
U.S. PATENT DOCUMENTS 3,825,805  7/1974  Belohoubeck et al. ................. 357/51

Primary Examiner—Edward J. Wojciechowicz

Attorney, Agent, or Firm—Pennie & Edmonds

[57] ABSTRACT

A microwave transistor having a base and an elongated collector is provided with an elongated, grounded, DC blocking capacitor co-extensive with the collector and the output capacitance ($C_{ob}$) is tuned within the transistor package by distributing along the collector a plurality of inductive wire leads connecting the collector to the base through the DC blocking capacitor. Ground returns are provided by base connections to ground on both the input and output sides of the transistor. Such an arrangement provides isolation between input and output while uniformly distributing the reactance of the tuning elements across the entire active area. The result is an increased power output as compared to conventional shunt tuning arrangements.

13 Claims, 3 Drawing Figures

MICROWAVE TRANSISTOR WITH DISTRIBUTED OUTPUT SHUNT TUNING

BACKGROUND OF THE INVENTION

1. Field of the Invention

This invention relates to transistors with improved output tuning and isolation.

2. History of the Art

High frequency power transistors typically utilize elongated collector and base electrodes connected to the collector and base contacts, respectively, of a plurality of constituent transistor cells. For one example of the structure of such transistors, see applicant's copending application, Ser. No. 849,302, filed Nov. 7, 1977, and assigned to applicant's assignee.

Various problems associated with impedance matching have prevented full realization of the potential power output from such devices. Microwave system requirements dictate that at useful frequencies and power levels a transistor package exhibit a predetermined output resistance, typically on the order of 50 ohms. This requirement means that the transistor resistance, often so low as 5 ohms, must be raised to a 50 ohm output and, for operation at a reasonable range of frequencies, the output capacitance ($C_{ob}$) must be tuned out.

One prior art method for tuning out the output capacitance involves disposing a pair of DC blocking capacitors at either end of the collector and introducing a shunt inductance through the disposition of bonding wires connecting the collector end regions through the respective blocking capacitors to the base.

The disadvantage of this approach, however, is that it fails to provide optimum tuning for all portions of the transistor. It provides different effective inductances to different regions of the elongated collector with consequent variation of the output resonance frequency along the collector. The result in an undue limitation on the power levels available at high frequencies.

Another prior art arrangement avoids this problem by providing distributed shunt inductance tuning connecting the base to the output line through a blocking capacitor. This result, however, is achieved at the expense of destroying isolation between the transistor input and output. As a consequence of this connection to base, the base can be connected to ground only on the input side with the consequence that both input and output signals flow through the base-to-ground connection. The result is the generation of feedback signals which can displace the gain from its optimum level and distort data signals.

Accordingly, there is a need for a microwave transistor with isolated input and output and distributed output shunt tuning.

SUMMARY OF THE INVENTION

In accordance with the invention, a microwave transistor having a base and an elongated collector is provided with an elongated, grounded, DC blocking capacitor co-extensive with the collector, and the output capacitance ($C_{ob}$) is tuned within the transistor package by distributing along the collector a plurality of inductive wire leads connecting the collector to the base through the DC blocking capacitor. Ground returns are provided by base connections to ground on both the input and output sides of the transistor. Such an arrangement provides isolation between input and output while uniformly distributing the reactance of the tuning elements across the entire active area. The result is an increased power output as compared to conventional shunt tuning arrangements.

BRIEF DESCRIPTION OF THE DRAWINGS

The nature, advantages, and various additional features of the invention will appear more fully upon consideration of the illustrative embodiments now to be described in detail in connection with the accompanying drawings.

In the drawings.

For convenience of reference, the same structural elements are given the same reference numeral throughout the drawings.

DETAILED DESCRIPTION OF THE DRAWINGS

Figure 1:
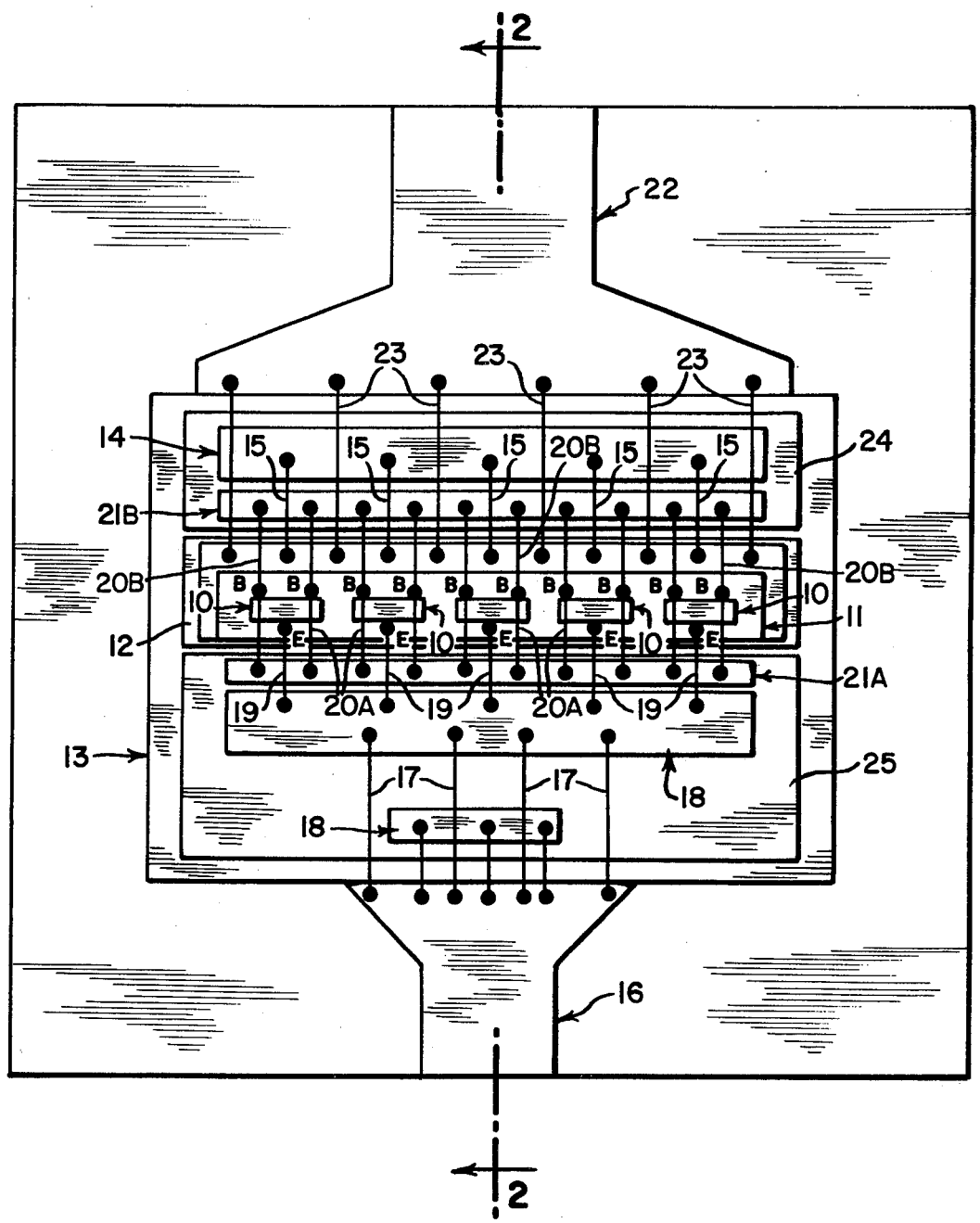
FIG. 1 is a schematic top view of a transistor device 11 utilizing the distributed output shunt tuning arrangement of the invention.
Figure 2:
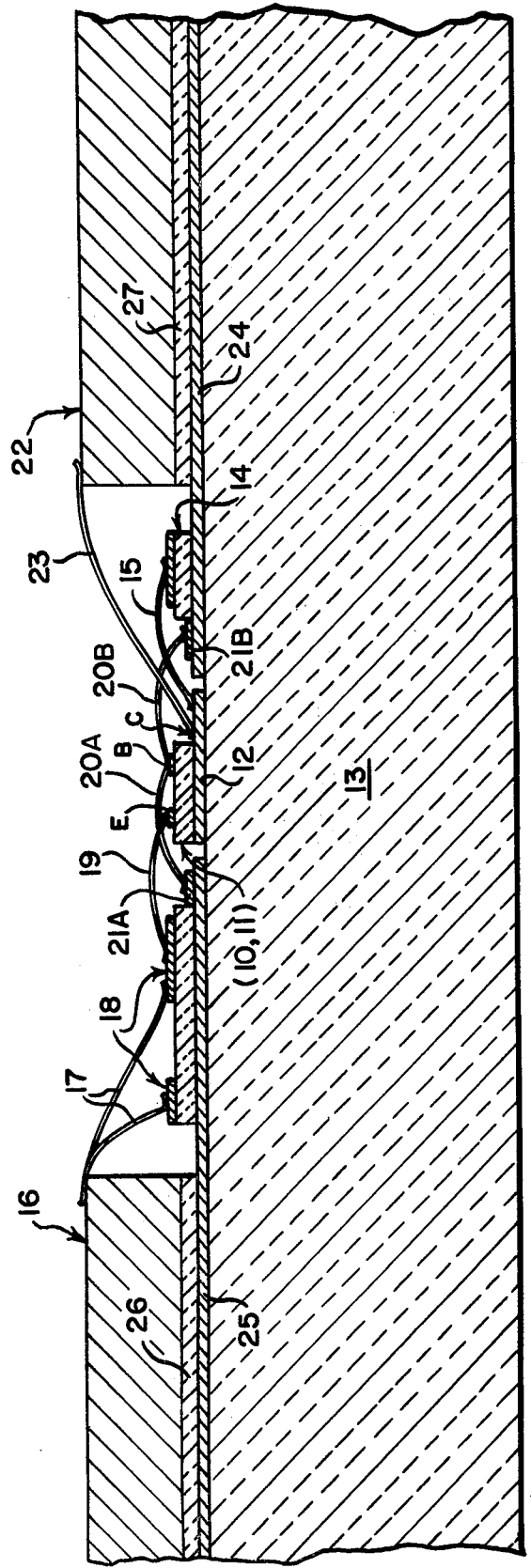
FIG. 2 is a cross-sectional view of the transistor device along line 2—2 of FIG. 1.

Referring to the drawings, FIGS. 1 and 2 schematically illustrate a preferred form of a microwave transistor device utilizing a distributed output shunt tuning arrangement in accordance with the invention. In substance, the device comprises one or more transistors 10, which can be formed on a transistor die 11, each of which has an emitter E, a base B, and an isolated collector C. The device has an elongated collector electrode 12 making electrical contact with the collector regions of transistors 10. Here the collector electrode conveniently comprises a gold collector mounting island plated onto a BeO chip carrier or package 13. An elongated DC blocking capacitor 14 substantially co-extensive with collector electrode 12, such as an MOS capacitor, is mounted on a ground plane 24 on chip carrier 13 preferably parallel to the collector electrode and adjacent thereto. A plurality of inductive bonding wires 15 distributed substantially uniformly along the length of collector electrode 12 connect the collector to the ground plane 24 through blocking capacitor 14. The number and length of bonding wires 15 are chosen empirically to tune out the output capacitance ($C_{ob}$) of the device transistors in, or close to, the frequency range of operation.

Microwave input means is provided preferably in the form of a dielectric stripline 16 connected by input lead wires 17 to shunt input capacitors 18 and thence to the emitters E of the respective transistors 10 through emitter lead wires 19. Capacitors 18 are mounted on a ground plane 25. The bases B of respective transistors 10 are connected via base lead wires 20A and 20B to ground bars 21A, and 21B on the input and output sides, respectively, and microwave output means is provided preferably by dielectric stripline 22 connected to the collector electrode via output leads 23. Striplines 16, 22 are isolated from ground planes 24, 25 by alumina layers 26, 27.

Figure 3:
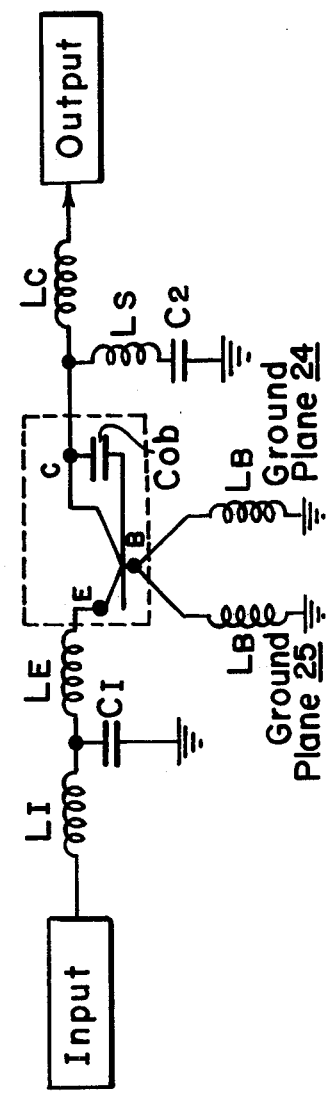
FIG. 3 is a schematic equivalent circuit of the device of FIG. 1.

The operation of this device can be better understood by reference to FIG. 3 which is an equivalent circuit diagram of the device shown in FIGS. 1 and 2. The input means is represented by inductors $L_I$ and $L_E$ corresponding to the inductances of the input leads 17 and the emitter leads 19 and shunt capacitor $C_I$ corresponding to the capacitance of input capacitor 18. The input capacitor is part of a matching network used to transform the transistor input impedance to the system impedance.

Inductor $L_B$ corresponds to the inductances of the base leads 20A and 20B, here assumed to be equal.

At the output, capacitor ($C_{ob}$) corresponds to the transistor output capacitance, $L_S$ corresponds to the inductance of the distributed shunt tuning bonding wires 15, and capacitor $C_2$ corresponds to the capacitance of DC blocking capacitor 14. Inductor $L_C$ corresponds to the inductance of the collector output leads 23.

The values of $L_I$, $C_I$, and $L_E$ vary depending on the transistor impedance. The value of $L_c$ varies with the packaging of the transistor. Typical values for the remaining parameters and the resonant frequency, $F_o$, of a microwave power transistor operating in the three to four gigaHertz frequency range are listed in Table 1, below:

Table 1

|  | Example 1 | Example 2 | Example 3 |
|---|---|---|---|
| $L_B$ | 0.1 nH | 0.01 nH | 0.002 nH |
| $C_{ob}$ | 1.0 pF | 10 pF | 50 pF |
| $L_s$ | 2 nH | 0.2 nH | .04 nH |
| $C_2$ | $\geq$ 100 pF | $\geq$ 100 pF | $\geq$ 500 pF |
| $F_o$ | 3.5 GHz | 3.5 GHz | 3.5 GHz |

In these examples, all values are approximate. Example 1 is a 1 watt power transistor, Example 2 is a 10 watt power transistor, and Example 3 is a 50 watt power transistor. As will be evident, $L_B$, $C_{ob}$, and $L_s$ vary linearly with output power. $C_2$ is a DC blocking capacitor which should have sufficiently high capacitance to make the circuit look like a short circuit at operating frequencies. In practice, $C_2$ should be large (approximately ten times greater, or more) than $C_{ob}$. $F_o$ may be determined by $$F_o = \frac{1}{2\pi} \sqrt{\frac{1}{(L_S + L_B) C_{ob}}}$$

The primary advantage of this arrangement is that it provides symmetrically-balanced tuning throughout the active region of the device and thus permits higher power outputs at a given high frequency or higher frequencies at a given minimum power output. For example, tests indicate that this arrangement can provide a 10 percent increase in the power output of a 20 watt Class C bipolar silicon transistor at 3.5 gigaHertz. Moreover, resonance frequencies in excess of 4 gigaHertz can be achieved at high power outputs. Such levels cannot presently be attained using conventional shunt tuning arrangements for power levels greater than approximately 10 watts.

While the invention has been described in connection with a small number of specific embodiments, it will be understood that these are merely illustrative of the many other specific embodiments which can also utilize the principles of the invention. For example, DC blocking capacitor 14 could be implemented in the form of several such capacitors extending along the elongated collector electrode; and the term "capacitance means" as used in the claims shall be understood to refer to one or more such capacitors. Numerous other devices can be made by those skilled in the art without departing from the spirit and scope of the invention.

I claim:

1. An improved microwave transistor device of the type having an output capacitance and comprising emitter means, base means, isolated collector means contacting an elongated collector electrode, and separate ground contact means for the input side and for the output side of the device, said improvement comprising:
   an elongated, grounded, DC blocking capacitor substantially co-extensive with said elongated collector electrode;
   conductive means connecting said base means to said ground contact means for the input side of the device;
   conductive means connecting said base means to said ground contact means for the output side of the device; and
   a plurality of inductive means substantially uniformly spaced along the length of said elongated collector electrode connecting said electrode to said blocking capacitor to provide uniformly distributed inductances shunting said output capacitance, said inductive means having an inductive reactance substantially shunt tuning the capacitive reactance of said output capacitance at a desired operating frequency.

2. A transistor device according to claim 1 wherein said plurality of inductive means comprise a plurality of wire leads.

3. A transistor device according to claim 1 wherein said transistor device comprises a plurality of transistors having their respective collectors disposed in electrical contact with said elongated collector electrode.

4. A transistor device according to claim 1 wherein:
   said transistor device comprises a plurality of transistors formed within a common die having collector contacts on one surface of said die; and
   said elongated electrode comprises a conductive metal mounting region disposed on a substrate for receiving the collector contact surface of said die.

5. A transistor device according to claim 1 wherein said DC blocking capacitor is adjacent and substantially parallel to said elongated collector electrode.

6. An improved microwave transistor device of the type having an output capacitance and comprising emitter means, base means, collector means contacting an elongated isolated collector electrode, and ground means, said improvement comprising:
   capacitance means contacting said ground means and extending the length of said elongated collector electrode; and
   a plurality of inductive means substantially uniformly distributed along the length of said elongated collector electrode connecting said electrode to said capacitance means and providing uniformly distributed inductance shunting said output capacitance, said inductive means having an inductive reactance such as to substantially tune out the capacitive reactance of said capacitance means at a desired operating frequency.

7. A transistor device according to claim 6 wherein said plurality of inductive means comprise a plurality of wire leads.

8. A transistor device according to claim 6 wherein said transistor device comprises a plurality of emitter means and base means.

9. A transistor device according to claim 6 wherein:

said transistor device comprises a plurality of transistors formed within a common die having on one surface of said die a contact to the collector means of said transistors; and said elongated electrode comprises a conductive metal mounting region disposed on a substrate for receiving the collector contact surface of said die.

10. A transistor device according to claim 6 wherein said capacitance means is a single capacitor.

11. A transistor device according to claim 10 wherein said capacitor is adjacent and substantially parallel to said elongated collector electrode.

12. A transistor device according to claim 6 wherein said capacitance means is a plurality of capacitors.

13. A transistor device according to claim 12 wherein said capacitors are adjacent to said elongated collector electrode and extend in a direction substantially parallel thereto.

* * * * *